United States Patent
Hong et al.

(10) Patent No.: US 9,359,690 B2
(45) Date of Patent: Jun. 7, 2016

(54) PROCESS FOR GROWING SILICON CARBIDE SINGLE CRYSTAL AND DEVICE FOR THE SAME

(75) Inventors: Sung Wan Hong, Daejeon (KR); Young Shol Kim, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 463 days.

(21) Appl. No.: 13/880,562

(22) PCT Filed: Oct. 17, 2011

(86) PCT No.: PCT/KR2011/007701
§ 371 (c)(1),
(2), (4) Date: Jun. 28, 2013

(87) PCT Pub. No.: WO2012/053782
PCT Pub. Date: Apr. 26, 2012

(65) Prior Publication Data
US 2013/0305982 A1    Nov. 21, 2013

(30) Foreign Application Priority Data
Oct. 21, 2010   (KR) .................. 10-2010-0103046

(51) Int. Cl.
*C30B 15/02*   (2006.01)
*C30B 15/00*   (2006.01)
(Continued)

(52) U.S. Cl.
CPC ............. *C30B 15/002* (2013.01); *C30B 11/001* (2013.01); *C30B 15/02* (2013.01);
(Continued)

(58) Field of Classification Search
CPC ........ C30B 15/00; C30B 29/06; C30B 15/02; C30B 15/002; C30B 27/02; C30B 11/001; C30B 13/08; C30B 35/00; Y10T 117/1032
USPC ...................... 117/11, 13, 18, 19, 30, 33, 214
See application file for complete search history.

(56) References Cited

U.S. PATENT DOCUMENTS 5,858,087 A * 1/1999 Taguchi et al. ............... 117/213
2005/0183657 A1   8/2005 Kusunoki et al.
(Continued)

FOREIGN PATENT DOCUMENTS

EP    2 138 610    12/2009
JP    9183688 A    7/1997
(Continued)

OTHER PUBLICATIONS

European Patent Office, English Computer translation of JP 2005-179080 (2015).*
(Continued)

*Primary Examiner* — Matthew Song
(74) *Attorney, Agent, or Firm* — The Webb Law Firm

(57) ABSTRACT

Provided is a method for manufacturing a silicon carbide single crystal using a solution process including coming a seed crystal substrate for growing silicon carbide into contact with a Si—C alloy solution including at least one additive metal and growing the silicon carbide single crystal on a seed crystal for growing silicon carbide, including feeding a silicon feedstock into an alloy solution when a molar ratio of Si and the additive metal is lower than an initially set value as the reaction progresses. The method increases a crystal growth speed, maintains the growth speed, and prevents the growth from unwillingly stopping when the silicon carbide single crystal is manufactured using a solution growth process.

2 Claims, 2 Drawing Sheets

(51) Int. Cl.
*C30B 11/00* (2006.01)
*C30B 17/00* (2006.01)
*C30B 19/02* (2006.01)
*C30B 29/36* (2006.01)
*H01L 21/02* (2006.01)

(52) U.S. Cl.
CPC ............. *C30B 17/00* (2013.01); *C30B 19/02* (2013.01); *C30B 29/36* (2013.01); *H01L 21/02529* (2013.01); *H01L 21/02628* (2013.01); *Y10T 117/1032* (2015.01); *Y10T 117/1056* (2015.01)

(56) References Cited

U.S. PATENT DOCUMENTS

| | | | |
|---|---|---|---|
| 2006/0060133 A1* | 3/2006 | Nakashima et al. | 117/218 |
| 2007/0022945 A1 | 2/2007 | Mueller | |
| 2007/0209573 A1 | 9/2007 | Kusunoki et al. | |
| 2010/0294999 A1* | 11/2010 | Narushima et al. | 252/512 |

FOREIGN PATENT DOCUMENTS

| | | | | |
|---|---|---|---|---|
| JP | 2000-264790 | | 9/2000 | |
| JP | 20042173 A | | 1/2004 | |
| JP | 2005-179080 | | 7/2005 | |
| JP | 2005179080 A | * | 7/2005 | ............. C30B 19/00 |
| JP | 2007-261844 | | 10/2007 | |
| JP | 2009-263178 | | 11/2009 | |
| WO | WO 2008133278 A1 | * | 11/2008 | ............. C30B 15/04 |

OTHER PUBLICATIONS

European Search Report dated May 15, 2014 in European Application No. 11834582.6 (related to U.S. Appl. No. 13/880,562).

* cited by examiner

PROCESS FOR GROWING SILICON CARBIDE SINGLE CRYSTAL AND DEVICE FOR THE SAME

CROSS REFERENCE TO RELATED APPLICATIONS

This application is a national phase application of International Application No. PCT/KR2011/007701, filed Oct. 17, 2011, the content of which is incorporated herein by reference.

TECHNICAL FIELD

The present invention relates to a method for manufacturing a silicon carbide single crystal using a solution process and a device for manufacturing a single crystal used in the same.

BACKGROUND ART

Having a characteristic that is better than that of silicon as a semiconductor material that has been most frequently used in recent years, a compound semiconductor material such as silicon carbide, gallium nitride (GaN) and aluminum nitride has been extensively studied as the next generation semiconductor material. Particularly, silicon carbide has excellent mechanical strength, thermal stability, and chemical stability, very high thermal conductivity of 4 W/cm$^2$ or more, and an operation critical temperature of 650° C. or less, which is even higher than the operation critical temperature of 200° C. or less of silicon. Further, when a crystalline structure is 3C silicon carbide, 4H silicon carbide, and 6H silicon carbide, band gaps are 2.5 eV or more, which is two times higher than that of silicon, such that silicon carbide is very useful as a semi-conductor material for high electric power and low loss conversion devices and, recently, has been considered as a light semiconductor such as an LED and a semi-conductor material for converting electric power.

Typically, examples of a process for growing a silicon carbide single crystal include an Acheson process for reacting carbon and silica in a high temperature electric furnace at 2000° C. or more, a sublimation process for sublimating silicon carbide as a raw material at a high temperature of 2000° C. or more to grow the single crystal, and a chemical vapor deposition process for performing chemical deposition using a gas source.

In the processes, it is very difficult to manufacture a silicon carbide single crystal having high purity using the Acheson process, and the silicon carbide single crystal is grown in a limited thickness to form a thin film by the chemical vapor deposition process. Accordingly, studies of growth of the silicon carbide single crystal are focused on the sublimation process for sublimating silicon carbide at high temperatures to grow crystals.

However, the sublimation process is typically performed at a high temperature of 2200° C. or more and has a strong possibility of generating various faults such as a micropipe and stacking faults, thus being limited in terms of costs of production.

A liquid phase growth process using a Czochralski process is used to grow a silicon carbide single crystal, avoiding disadvantages of the sublimation process. The liquid phase growth process for silicon carbide single crystal typically includes charging silicon or silicon carbide powder in a graphite crucible, increasing the temperature to about 1600 to 1900° C., and coming the silicon carbide seed disposed at an upper side of the crucible into contact with molten liquid to grow crystals from the surface of the silicon carbide seed. However, the process has low economic efficiency because of a very low crystal growth speed of 50 μm/hr or less.

DISCLOSURE OF INVENTION

Technical Problem

An object of the present invention is to provide a method for manufacturing silicon carbide, which increases a crystal growth speed, maintains the growth speed, and prevents the growth from unwillingly stopping when a silicon carbide single crystal is manufactured using a solution growth process.

Another object of the present invention is to provide a device for manufacturing silicon carbide, efficiently and periodically feeding a silicon feedstock during growth of a crystal.

Solution to Problem

In one general aspect, a method for manufacturing a silicon carbide single crystal including coming a seed crystal substrate for growing silicon carbide into contact with a Si—C alloy solution including at least one additive metal and growing the silicon carbide single crystal on a seed crystal for growing silicon carbide, includes feeding a silicon feedstock into an alloy solution when a molar ratio of Si and the additive metal is lower than an initially set value as the reaction progresses.

At least one selected from silicon, a mixture of silicon and carbon, and silicon carbide may be used as the silicon feedstock.

A feeding amount of the silicon feedstock may depend on a calculated molar reduction amount of silicon of the alloy solution based on a growth thickness of the silicon carbide single crystal as the reaction progresses.

It is preferable that the feeding of a silicon feedstock is performed several times in an amount of up to 0.02 to 15 wt % based on an amount of a silicon element in a crucible in views of melting the additionally fed silicon feedstock and homogeneity of the grown silicon carbide single crystal.

The feeding of a silicon feedstock may be performed in the same atmospheric gas as an atmospheric gas in a crucible.

The feeding of a silicon feedstock may be performed at a pressure that is higher than a pressure in the crucible.

In another general aspect, a device for manufacturing a silicon carbide single crystal using a solution growth process, which includes a crucible receiving a Si—C alloy solution including at least one additive metal in a growth furnace and a seed crystal fixed shaft including a seed crystal substrate for growing silicon carbide, includes a silicon feed unit feeding a silicon feedstock into the crucible.

In consideration of the rotatable crucible, the silicon feed unit may include a feed tube having a tube shape formed through at least a portion of the seed crystal fixed shaft.

For convenience of the provision, the silicon feed unit may include a feed tube having a tube shape separated from the seed crystal fixed shaft.

The silicon feed unit may include a gas supply tube supplying an atmospheric gas.

Advantageous Effects of Invention

According to a method for manufacturing a silicon carbide single crystal of a general aspect of the present invention, silicon and another metal are further included in an alloy solution to prevent a growth speed of the single crystal from being reduced and growth of the single crystal from unwillingly stopping, thus increasing the growth speed of the single crystal.

According to a device for manufacturing a silicon carbide single crystal of another general aspect of the present invention, a silicon feedstock is fed through a separate feeding entrance to prevent growth of the single crystal of a seed from being hindered and additionally and easily feeding silicon as the reaction progresses while atmosphere pressure in a reaction crucible is not reduced.

BRIEF DESCRIPTION OF DRAWINGS

The above and other objects, features and advantages of the present invention will become apparent from the following description of preferred embodiments given in conjunction with the accompanying drawings, in which.

Figure 1:
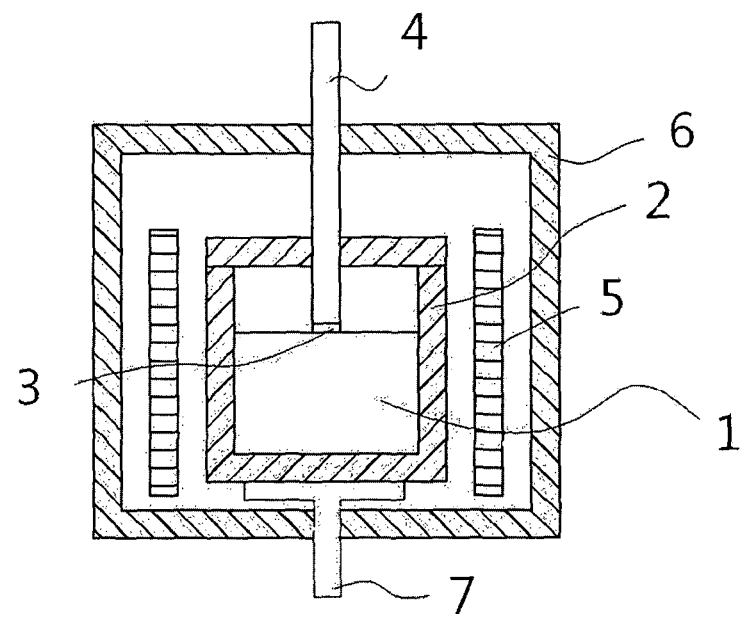
FIG. 1 is a schematic view illustrating an example of a device for manufacturing a silicon carbide single crystal using a known solution growth process.

DETAILED DESCRIPTION OF MAIN ELEMENTS 1, 11: alloy solution
2, 12: crucible
3, 13: substrate
4, 14: seed crystal fixed shaft
5, 15: heat emitting body
6, 16: growth furnace
7, 17: lower plate
51: silicon feedstock supply tube
52: silicon feedstock feed valve
53: gas supply valve
54: gas connection tube
55: silicon feedstock storage hopper
56: silicon feedstock feeding entrance
57: manometer

BEST MODE FOR CARRYING OUT THE INVENTION

Hereinafter, the embodiments of the present invention will be described in detail with reference to accompanying drawings.

The present invention relates to a method for manufacturing a silicon carbide single crystal including coming a seed crystal substrate for growing silicon carbide into contact with a Si—C alloy solution including at least one additive metal and growing the silicon carbide single crystal on a seed crystal for growing silicon carbide using a solution growth process, which includes feeding a silicon feedstock into an alloy solution when a molar ratio of Si and the additive metal is lower than an initially set value as the reaction progresses.

In the above and following descriptions, it will be understood that the term "silicon feedstock" includes all raw materials not hindering a reaction of an alloy solution and supplying silicon, and examples thereof may include silicon, a mixture of silicon and carbon, or silicon carbide, but are not limited thereto.

A typical solution growth process of a silicon carbide single crystal includes coming a silicon carbide seed crystal into contact with a solution having dissolved carbon in a solution including silicon (hereinafter, referred to as 'Si—C solution') to grow the silicon carbide single crystal. The silicon carbide seed crystal in contact with the Si—C solution comes into contact with a front end of the seed crystal fixed shaft and drawn by the seed crystal fixed shaft to grow the silicon carbide single crystal from the Si—C solution on the silicon carbide seed crystal.

In the solution growth process of the silicon carbide single crystal, the Si—C solution has a low carbon solubility in the solution and a low concentration of silicon carbide in the solution, causing a low growth speed of a crystal.

Studies have been made of adding at least one additive metal to the Si—C solution to avoid the disadvantages. The ratio of Si and additive metal in the alloy solution largely affects the growth speed, and with respect to this, studies have been made for an optimum composition ratio and desired types of additive metal. The additive metal includes various transition metals or mixtures thereof selected in consideration of the growth speed of the single crystal but is not limited thereto, and examples thereof may include Ti, Cr, Al, Fe, Co, Dy or La.

Silicon of the alloy solution is a metal element participating in growth of the silicon carbide single crystal, and other metal elements are used as additive metal. In other words, metals other than silicon are added to reduce a melting point and do not directly participate in the reaction in growth of the silicon carbide single crystal.

Accordingly, the concentration of silicon of the alloy solution is reduced as the reaction progresses to break the balance of the initially set ratio of Si and additive metal. Therefore, unwillingly, the growth speed of the single crystal is significantly reduced or, in extreme cases, the growth may stop.

Accordingly, in the general aspect of the present invention, the silicon feedstock is fed into the alloy solution when a molar ratio of Si and the additive metal is lower than an initially set value as the reaction progresses.

The wording "feeding of the silicon feedstock" does not mean refeeding or additional feeding of the alloy solution, but means that only the silicon feedstock is fed, if necessary or periodically, into the alloy solution in which the main reaction occurs as the reaction progresses silicon feedstock.

When the silicon feedstock is fed as the reaction progresses, an amount thereof may be derived using various processes, and illustrative but non-limiting examples of the processes include a process for calculating the molar amount of Si of the alloy solution reduced as the reaction progresses based on a growth thickness of the silicon carbide single crystal and determining the amount of fed silicon within a predetermined range based on the calculated molar amount of Si reduced.

However, since the alloy solution is substantially melted so as not to include a solid in the crucible, when the silicon feedstock powder is fed, a reaction temperature is reduced or the alloy solution and the silicon feedstock powder are not homogeneously mixed, thus negatively affecting physical properties of the grown single crystal.

In consideration of this, it is preferable that the feeding of a silicon feedstock is performed several times in an amount of up to 0.02 to 15 wt % based on an amount of a silicon element in a crucible in views of melting the additionally fed Si and homogeneity of the grown silicon carbide single crystal.

Further, affects to the external environmental by the inside of the alloy solution in which a reaction is performed needs to be minimized when the silicon feedstock is fed, accordingly, it is preferable that the silicon feedstock is fed in the same atmospheric gas as the atmospheric gas in the crucible.

It is preferable that the atmospheric gas in the crucible is a non-oxidizing atmospheric gas, and examples of the preferable non-oxidizing atmospheric gas may include one or more of gases such as He, Ne, and Ar. The inert gas may be used in a mixture form with nitrogen, or carbon-containing gas such as methane.

When the silicon feedstock is added to the alloy solution, it is preferable that the silicon feedstock is fed in the same atmospheric gas as the atmospheric gas in the crucible so as not to hinder the atmosphere in the crucible.

Further, it may be preferable that the silicon feedstock is fed at a pressure that is higher than that of the crucible in the method for manufacturing the silicon carbide single crystal in order to prevent the reaction solution from evaporating. Examples of a process for feeding the silicon feedstock at a pressure that is higher than that of the crucible may include a process for applying a vacuum, supplying the same gas as the atmospheric gas in the crucible to form a high pressure environment, and feeding the silicon feedstock into the crucible.

It is preferable that the pressure in the crucible is 0.1 to 1 MPa, and the pressure may be typically an atmospheric pressure.

In the general aspect of the growth process of the silicon carbide single crystal using the solution growth process, silicon and various additive metal elements are added to the graphite crucible having high purity, and heated in an inert gas atmosphere to a set temperature to melt the feedstock. The continuous heating of the set temperature is performed to melt carbon in the solution from the crucible and form a silicon carbide solution. The continuous heating of the set temperature is performed until a concentration of carbon in the solution reaches a saturation concentration, and a seed crystal is then precipitated in the solution. The seed crystal is precipitated, and, after a while, the solution is slowly cooled to grow the silicon carbide single crystal on the seed crystal. The silicon feedstock is fed preferably after the temperature in the crucible is increased to 1300° C. or more and more preferably after the temperature is increased to 1650° C. or more, that is, after the crystal starts to grow in the solution during the growth of SiC.

When the silicon feedstock is fed as the reaction progresses to maintain the ratio of Si and additive metal within a predetermined range, a device for feeding the silicon feedstock is not particularly limited, but, for example, a general aspect of the present invention provides a device for manufacturing a silicon carbide single crystal using a solution growth process, which includes a crucible receiving a Si—C alloy solution including at least one additive metal and a seed crystal fixed shaft including a seed crystal substrate for growing silicon carbide, including a silicon feed unit feeding a silicon feedstock into the crucible.

In manufacturing the silicon carbide single crystal using the solution process, a device for manufacturing a silicon carbide single crystal includes a crucible receiving an alloy solution (solvent), for example, a graphite crucible, a solvent, an external heater such as a high frequency coil, an insulator, a seed crystal fixed shaft moving upward and downward to support a substrate, and the substrate provided at a front end of the seed crystal fixed shaft.

An embodiment thereof shown in FIG. 1 includes a crucible 2 containing an alloy solution 1 including silicon or additive metal; a seed crystal fixed shaft 4 to which a substrate 3 is attached; a heat emitting body 5; a growth furnace 6; and a lower plate 7 rotating the crucible if necessary.

The crucible 2 made of a graphite material may be used as a source providing carbon. Further, the heat emitting body 5 may be a resistance type heat emitting body or an inductive heating type heat emitting body. Inert gas such as argon or helium fills the growth furnace 6, and the degree of vacuum may be typically 100 to 1500 ton. A vacuum pump and a gas cylinder for controlling the atmosphere not shown in the drawings may be connected through a valve to the growth furnace 6 to maintain the above atmosphere.

Further, the seed crystal fixed shaft 4 connected to the substrate may move upward and downward and rotate at a predetermined rate to control a temperature distribution in the crucible. Further, the lower plate 7 supporting the crucible may rotate at predetermined rpm if necessary.

However, it may be difficult to feed the silicon feedstock during the growth of the single crystal by a device for growing the single crystal shown in FIG. 1.

Accordingly, the general aspect of the present invention provides a device for manufacturing a silicon carbide single crystal including a separate silicon feed unit to feed the silicon feedstock.

A detailed description is given of an embodiment of the present invention with reference to the accompanying drawings below.

Figure 2:
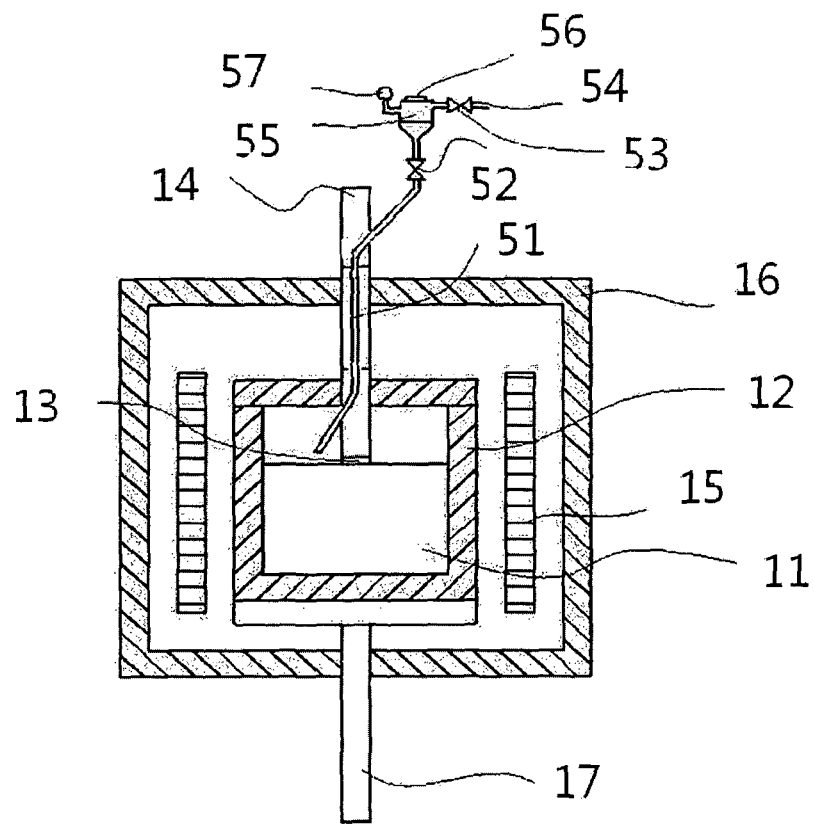
FIG. 2 is a schematic view of a device for manufacturing a silicon carbide single crystal according to a first embodiment of the present invention.

FIG. 2 illustrates a first embodiment of the device for manufacturing the silicon carbide single crystal including the silicon feed unit to feed the silicon feedstock in the general aspect of the present invention.

The device for manufacturing the silicon carbide single crystal according to the first embodiment is provided in consideration of the rotatable crucible, and the silicon feed unit may include a feed tube having a tube shape formed through at least a portion of the seed crystal fixed shaft.

To be specific, illustrative but non-limiting examples of elements constituting the silicon feed unit may include a silicon feedstock storage hopper 55, a silicon feedstock feed valve 52 controlling the silicon feedstock to be fed from the silicon feedstock storage hopper 55 to the growth furnace, a silicon feedstock feeding entrance 56 through which the silicon feedstock is supplied to the silicon feedstock storage hopper 55, and a gas connection tube 54 and a gas supply valve 53 controlling the atmosphere in the hopper. Further, a manometer 57 may be attached to measure pressure in the hopper. Further, a silicon feedstock feed tube 51 is formed through a seed crystal fixed shaft 14 to feed the silicon feedstock from the hopper to the crucible.

With respect to the feeding of the silicon feedstock into the crucible using the device, a predetermined amount of silicon feedstock is fed through the silicon feedstock feeding entrance 56 into the silicon feedstock storage hopper, and the feeding entrance is then closed to seal the hopper. In this connection, the silicon feedstock feed valve 52 to the growth furnace is closed. When the feeding of the silicon feedstock into the silicon feedstock storage hopper is finished, the hopper is evacuated through the gas connection tube 54 using an external vacuum pump (not shown). Subsequently, the same gas as the atmospheric gas in the growth furnace is supplied through the gas connection tube 54 to maintain a pressure that is higher than that of the growth furnace. Subsequently, the gas supply valve 53 is closed, and the silicon feedstock feed valve 52 is opened to feed the silicon feedstock from the hopper to the crucible 12.

Figure 3:
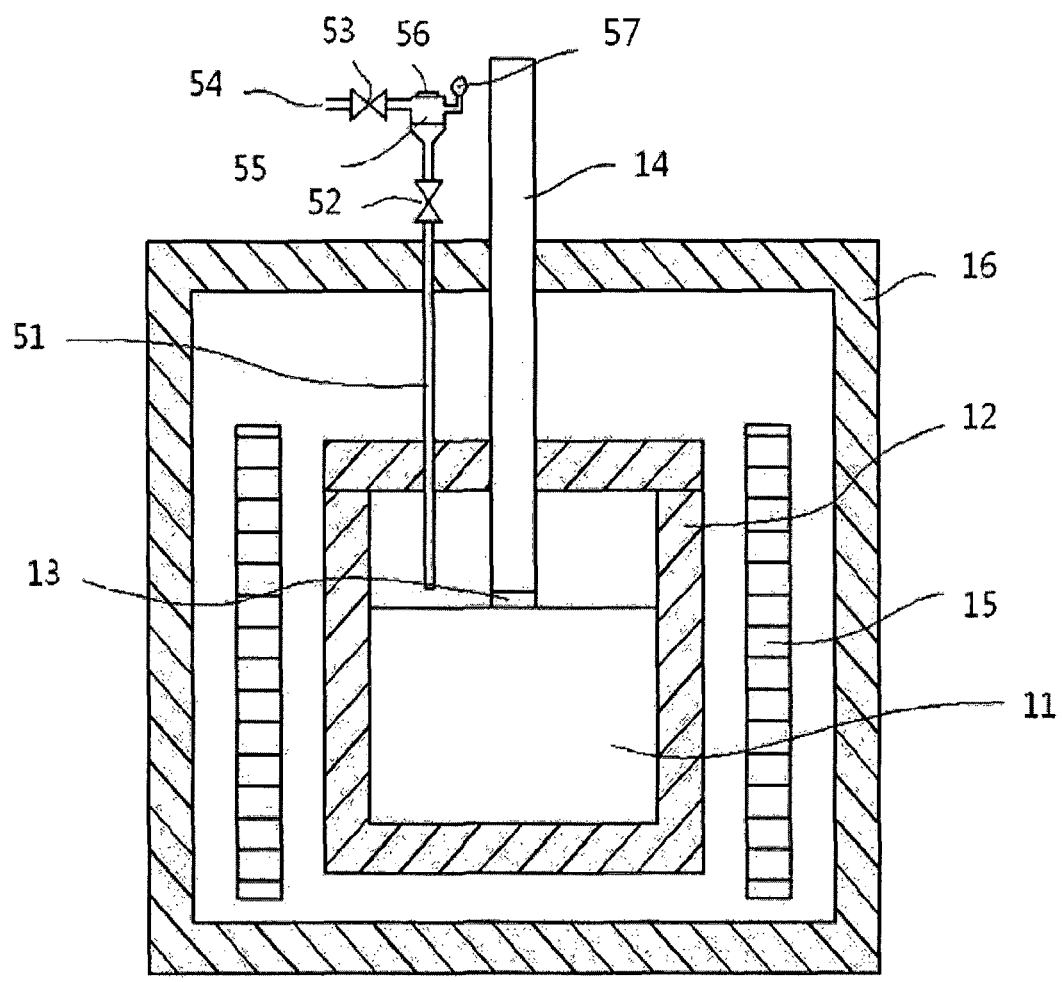
FIG. 3 is a schematic view of a device for manufacturing a silicon carbide single crystal according to a second embodiment of the present invention.

In the case where the crucible lower plate 17 in FIG. 2 does not need to be provided because the crucible does not need to rotate, the silicon feedstock feed tube does not need to be formed through the seed crystal fixed shaft unlike the first embodiment, and in this case, a separate silicon feed unit according to a second embodiment shown in FIG. 3 may include a feed tube separated from the seed crystal fixed shaft for the convenience of installation.

The device according to the second embodiment has the same constitutional elements and driving method as the device according to the first embodiment, with the exception of the formation position of the silicon feed unit, accordingly, a detailed description thereof is omitted.

INDUSTRIAL APPLICABILITY

According to general aspects of the present invention, it is preferable that a separate silicon feed unit is provided because a crystal continuously grows even though silicon solids are dispersed in a molten raw material.

The first and the second embodiments are set forth to illustrate a device for manufacturing a silicon carbide single crystal, but are not construed to limit the technical spirit of providing a silicon feed unit for additionally feeding a silicon feedstock according to the present invention.

The invention claimed is:

1. A device for manufacturing a silicon carbide single crystal using a solution growth process, which includes a crucible receiving a Si-C alloy solution in a growth furnace and a seed crystal fixed shaft including a seed crystal substrate for growing silicon carbide in a growth furnace, comprising: a silicon feed unit feeding a silicon feedstock into the crucible, wherein the silicon feed unit includes a feed tube having a tube shape formed through at least a portion of the seed crystal fixed shaft.

2. The device of claim 1, wherein the silicon feed unit includes a gas supply tube supplying an atmospheric gas.

* * * * *